(12) United States Patent
Abe et al.

(10) Patent No.: US 11,963,558 B2
(45) Date of Patent: Apr. 23, 2024

(54) CIRCUIT MOUNTED ARTICLE AND DEVICE

(71) Applicant: PANASONIC INTELLECTUAL PROPERTY MANAGEMENT CO., LTD., Osaka (JP)

(72) Inventors: Takatoshi Abe, Osaka (JP); Tomohiro Fukao, Osaka (JP); Tomoaki Sawada, Osaka (JP); Susumu Fukushima, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 339 days.

(21) Appl. No.: 17/603,765

(22) PCT Filed: Apr. 16, 2020

(86) PCT No.: PCT/JP2020/016743
§ 371 (c)(1),
(2) Date: Oct. 14, 2021

(87) PCT Pub. No.: WO2020/213683
PCT Pub. Date: Oct. 22, 2020

(65) Prior Publication Data
US 2022/0175057 A1 Jun. 9, 2022

(30) Foreign Application Priority Data
Apr. 18, 2019 (JP) .................................. 2019-079143

(51) Int. Cl.
*H05K 1/02* (2006.01)
*A41D 1/00* (2018.01)
*H05K 1/18* (2006.01)

(52) U.S. Cl.
CPC ........... *A41D 1/005* (2013.01); *H05K 1/0277* (2013.01); *H05K 1/181* (2013.01); *H05K 2201/2009* (2013.01)

(58) Field of Classification Search
CPC ...... H05K 1/0277; H05K 1/0283; H05K 1/09; H05K 2201/0311; H05K 2201/0355; A41D 1/002
See application file for complete search history.

(56) References Cited

U.S. PATENT DOCUMENTS

2002/0076948 A1  6/2002  Farrell et al.
2004/0224138 A1*  11/2004  Farrell ................ H05K 3/0058
                                                  428/209

(Continued)

FOREIGN PATENT DOCUMENTS

CN  107211534  9/2017
CN  108605412  9/2018

(Continued)

OTHER PUBLICATIONS

International Search Report issued in International Pat. Appl. No. PCT/JP2020/016743, dated Jul. 28, 2020, along with an English translation thereof.

*Primary Examiner* — Hoa C Nguyen
(74) *Attorney, Agent, or Firm* — Greenblum & Bernstein, P.L.C.

(57) ABSTRACT

A circuit mounted article to be fixed to a fabric is provided and includes a circuit board having flexibility, an electronic component mounted on a fabric facing face side, which faces the fabric, of the circuit board, and further a reinforcing portion to be used for fixing of the circuit mounted article to the fabric on the fabric facing face side of the circuit board.

14 Claims, 14 Drawing Sheets

(56) References Cited

U.S. PATENT DOCUMENTS

| | | | |
|---|---|---|---|
| 2017/0181276 A1 | 6/2017 | Sawada et al. | |
| 2018/0027661 A1* | 1/2018 | Ogura | H05K 3/284 |
| | | | 361/749 |
| 2018/0279467 A1 | 9/2018 | Kamakura | |
| 2018/0289189 A1 | 10/2018 | Lazzi et al. | |
| 2020/0267844 A1* | 8/2020 | Lim | H05K 1/189 |

FOREIGN PATENT DOCUMENTS

| | | |
|---|---|---|
| JP | 59-119057 | 8/1984 |
| JP | 2004-513247 | 4/2004 |
| JP | 2016-213915 | 12/2016 |
| JP | 2017-118109 | 6/2017 |
| JP | 2017-168437 | 9/2017 |
| JP | 2018-160575 | 10/2018 |

\* cited by examiner

CIRCUIT MOUNTED ARTICLE AND DEVICE

TECHNICAL FIELD

The present invention relates to a circuit mounted article and a device.

BACKGROUND ART

With the advancement of the electronics field, there is an increasing demand for miniaturization, thinning, weight reduction, and densification of electronic devices and the like. Depending on the application, a flexible device that can be disposed on a curved face, an uneven face and the like, freely deformed, or bent is required in some cases. In order to realize such a flexible device, it is investigated to use a flexible circuit board or the like as a circuit board provided in the device. Examples of the flexible circuit board include the flexible circuit board described in Patent Literature 1.

Patent Literature 1 describes a flexible circuit board for electronic component mounting, which is configured so that rigid reinforcing portions used at the time of component mounting are attached respectively to both sides of the flexible circuit board having a circuit wiring pattern for electronic component mounting.

According to Patent Literature 1, it is disclosed that automatic mounting of parts and the like are possible by attaching reinforcing portions having rigidity at the time of component mounting to the outside of the main body of the flexible circuit board. It is disclosed that the reinforcing portions can be simply separated and removed after component mounting to easily obtain an ordinary flexible circuit board subjected to mounting.

Examples of the flexible device as described above include wearable devices that can be worn on animals such as humans and dogs, and plants. Wearable devices are used in a state of being integrated with clothes or the like in some cases. In this case, the circuit board provided in the wearable device is not only required to be flexible but also required to be easily integrated with clothes or the like.

CITATION LIST

Patent Literature

Patent Literature 1: JP S59-119057 U

SUMMARY OF INVENTION

An object of the present invention is to provide a circuit mounted article that can be suitably fixed to a fabric, and a device in which a circuit mounted article is suitably fixed to a fabric.

An aspect of the present invention is a circuit mounted article to be fixed to a fabric, the circuit mounted article including a circuit board having flexibility, an electronic component mounted on a fabric facing face side, which faces the fabric, of the circuit board, and further a reinforcing portion to be used for fixing of the circuit mounted article to the fabric on the fabric facing face side of the circuit board.

DESCRIPTION OF EMBODIMENTS

According to the investigation by the present inventors, in the case of a conventional circuit board, even if it is a flexible circuit board, the circuit board is torn from the sewn part in some cases when the circuit board is sewn to a fabric in order to fix the circuit board to the fabric that constitutes clothes. For example, in the flexible circuit board described in Patent Literature 1, a rigid reinforcing portion to be used at the time of component mounting is attached to both sides of the flexible circuit board as described above. However, in the case of the flexible circuit board described in Patent Literature 1, only a reinforcing portion is attached to solve the difficulty of component mounting due to the flexibility of the circuit board, and this reinforcing portion is not intended not to be torn from the part where the reinforcing portion is sewn on the fabric. In the case of the flexible circuit board described in Patent Literature 1, it is intended that the reinforcing portion is separated and removed after component mounting. It is considered that the flexible circuit board described in Patent Literature 1 is intended so that the reinforcing portion does not interfere with the mounting of electronic components also from the fact that the face on which the reinforcing portion is provided is on the opposite side to the mounting face on which the electronic components are mounted.

As a result of various investigations, the present inventors have found out that the above object to provide a circuit mounted article that can be suitably fixed to a fabric and a device in which a circuit mounted article is suitably fixed to a fabric can be achieved by the following present invention.

Hereinafter, embodiments according to the present invention will be described, but the present invention is not limited thereto.

Figure 1:
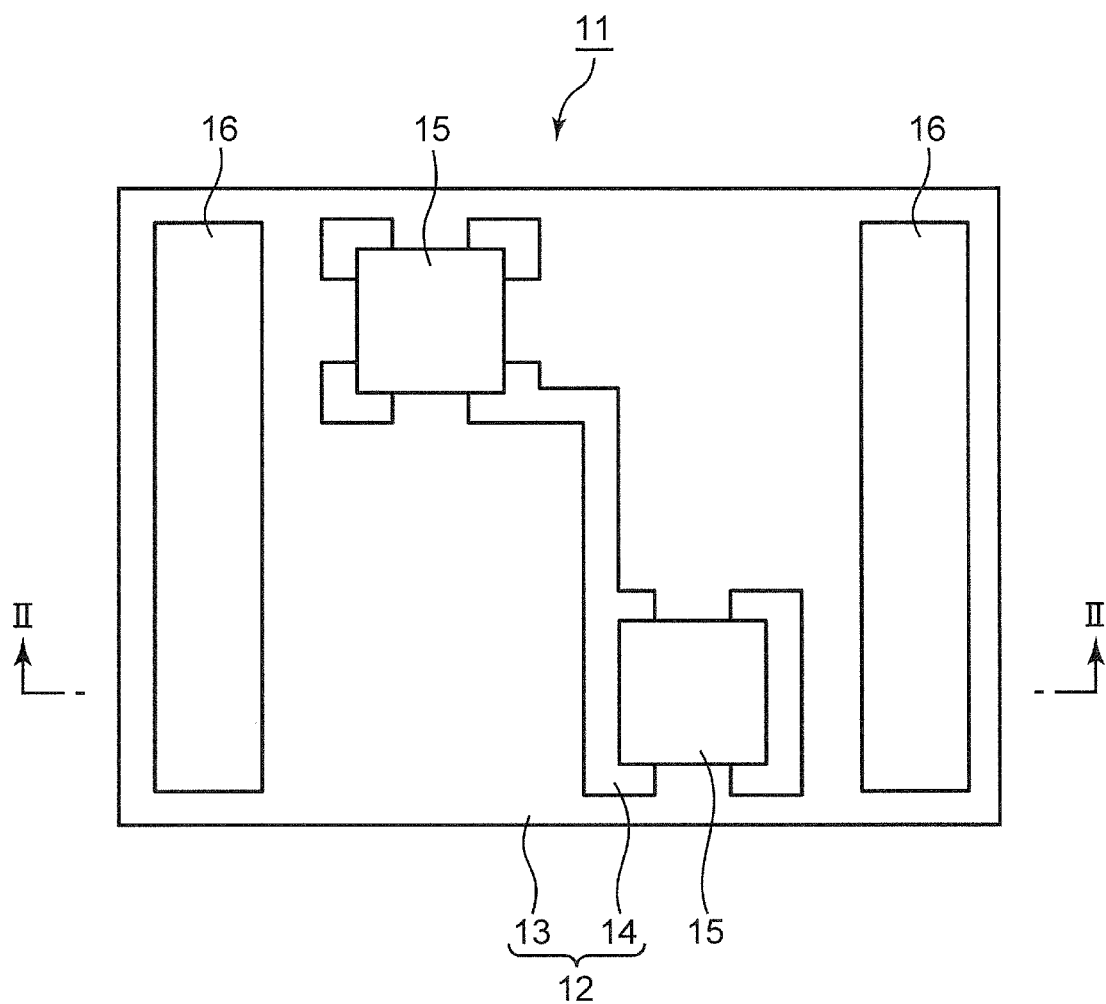
FIG. 1 is a top view illustrating an example of a circuit mounted article according to an embodiment of the present invention.
Figure 2:
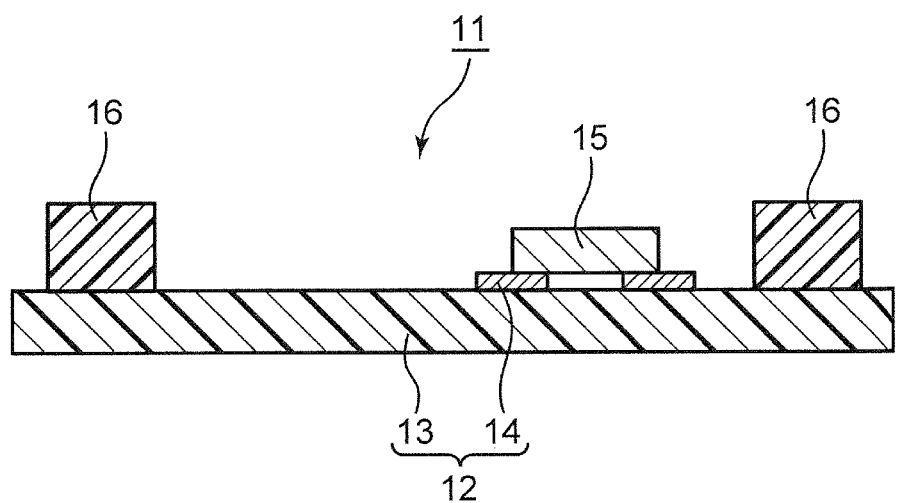
FIG. 2 is a sectional view of the circuit mounted article illustrated in FIG. 1 as viewed from a cut plane line II-II.

The circuit mounted article according to an embodiment of the present invention is a circuit mounted article to be fixed to a fabric. As illustrated in FIGS. 1 and 2, a circuit mounted article 11 includes a circuit board 12 having flexibility and an electronic component 15 mounted on one face side of the circuit board 12 (the fabric facing face side, which faces the fabric, of the circuit board 12). The circuit mounted article 11 further includes a reinforcing portion 16 to be used for fixing of the circuit mounted article to the fabric on the fabric facing face side of the circuit board 12. FIG. 1 is a top view (diagram of top face viewed from the fabric facing face side) illustrating an example of the circuit mounted article 11 according to the present embodiment. FIG. 2 is a sectional view of the circuit mounted article 11 illustrated in FIG. 1 as viewed from the cut plane line II-II.

Figure 3:
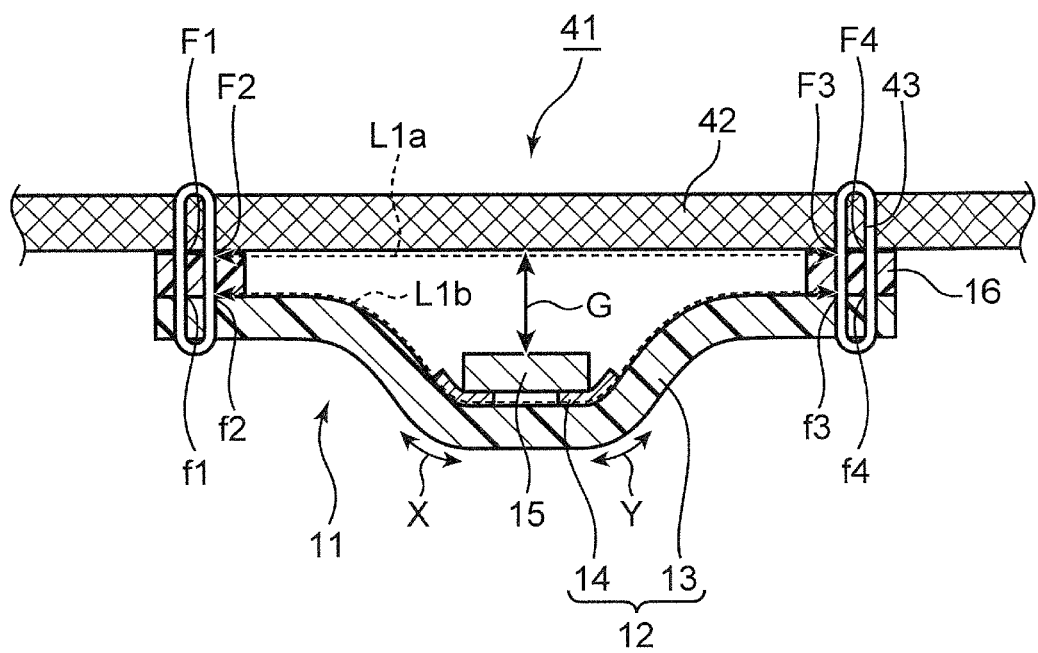
FIG. 3 is a sectional view illustrating an example of a device according to another embodiment of the present invention.

When the circuit mounted article is fixed to the fabric, the obtained device has a configuration in which the reinforcing portion and the fabric are fixed with a fixing member (see FIG. 3). In other words, the reinforcing portion functions as a fabric fixing jig for the purpose of fixing the circuit mounted article to the fabric. As the fixing member having a function of fixing the circuit mounted article to the fabric, a fastener such as a stapler, a thread, an adhesive or the like is assumed. FIG. 3 is a sectional view illustrating an example of a device 41 according to another embodiment of the present invention. FIG. 3 illustrates a configuration where a thread is adopted as a fixing member 43. In FIG. 3, the circuit mounted article 11 and the fabric 42 are fixed to each other since the thread, which is the fixing member 43, penetrates the reinforcing portion 16, the circuit board 12, and the fabric 42 and is tied. On the other hand, when the circuit mounted article does not have a reinforcing portion, there is the possibility that the circuit board tears starting from the place where the thread penetrates the circuit board since the circuit board having flexibility is weaker in strength than a circuit board that does not have flexibility but has a high elastic modulus. On the other hand, the circuit mounted article according to the present embodiment has the reinforcing portion, and the thread, which is the fixing member, penetrates the reinforcing portion as well as the circuit board, and it is thus possible to diminish the risk that the circuit board is torn starting from the place where the thread penetrates. Even when a fastener or an adhesive is adopted as the fixing member, the risk that the circuit board is damaged can be diminished by fixing the fabric and the circuit mounted article with the reinforcing portion having a function as a fabric fixing jig interposed therebetween.

In the circuit mounted article, the electronic component and the reinforcing portion are disposed on the fabric facing face side of the circuit board as described above. When the circuit mounted article is fixed to the fabric (the circuit mounted article and the fabric are fixed so that the fabric facing face side of the circuit board faces the fabric), for example, as illustrated in FIG. 3, the electronic component is in a state of being surrounded by the fabric and the circuit board. For this reason, the risk can be diminished that the circuit component unintentionally comes into contact with a person, a hard substance or the like and the electronic component itself is damaged or cracking occurs in the solder that is responsible for the electrical connection between the electronic component and the wiring pattern on the circuit board.

The circuit mounted article may be fixed to the fabric so that the face of the fabric opposite to the fabric facing face side of the circuit board is a face that comes into contact with a person or the like (hereinafter, also referred to as a contact assumed face with a person or the like) when the circuit mounted article is fixed to the fabric. In this case, a configuration may be adopted in which the reinforcing portion and the electronic component is not disposed on the contact assumed face with a person or the like. When the reinforcing portion and the electronic component are not disposed on the contact assumed face with a person or the like, the surface of the circuit board having flexibility only touches the human body even if the human body comes into contact with the contact assumed face with a person or the like, and it can be diminished that the circuit component and the reinforcing portion give damage to the human body and also that the circuit component and the reinforcing portion are damaged. For example, when the fabric illustrated also in FIG. 3 is clothes, it is possible to diminish the discomfort when a person wears the clothes (the unpleasant feeling when the circuit mounted article touches the human body) even if the circuit mounted article is attached to the inner side of the clothes as illustrated in FIG. 3.

The circuit mounted article may be fixed to the fabric so that the face of the fabric opposite to the fabric facing face side of the circuit board is a face that comes into contact with the outside (hereinafter, also referred to as a contact assumed face with the outside) when the circuit mounted article is fixed to the fabric. In other words, the circuit mounted article may be fixed to the fabric so that the contact assumed face with a person or the like in the above case becomes the contact assumed face with the outside. In this case as well, a configuration may be adopted in which the reinforcing portion and the electronic component is not disposed on the contact assumed face with the outside. By doing so, for example, even when the circuit mounted article including the electronic component such as LED or a display device is fixed to a fabric, such as clothing or shoes, that is deformed by the exercise of a person or the like, the display functions of LED, display devices and the like are not impaired. The material body or the like only touches the surface of the circuit board having flexibility even if the material body or the like comes into contact with the contact assumed face with the outside. It can be diminished that the circuit component and the reinforcing portion give damage to the material body or the like and also that the circuit component and the reinforcing portion are damaged.

The device may have a configuration in which the circuit mounted article including the circuit board is sandwiched between the fabrics. In other words, a configuration may be adopted in which the circuit board 12 in FIG. 3 is further provided with a fabric on the side opposite to the fabric 42 (not illustrated). The fabric provided on the side opposite to the fabric 42 may be the same fabric as the fabric 42 or a fabric different from the fabric 42. The circuit board may or may not be fixed to the fabric provided on the side opposite to the fabric 42. A configuration can be adopted in which the circuit board is not exposed to the contact assumed face with a person or the like and the contact assumed face with the outside, and thus it can be diminished that the circuit component comes into contact with a person, a material body, and the like and that the circuit board, the human body, the material body, and the like are damaged.

Since the circuit mounted article is assumed to be fixed to a fabric such as clothing, the property of the circuit board 12 is assumed to have flexibility so as to cause relatively little discomfort when the circuit board 12 touches the skin, and the circuit board 12 may further have stretchability. Hereinafter, the circuit board 12 having flexibility will be referred to as a flexible circuit board, and a circuit board also having stretchability will be referred to as a stretchable circuit board.

Figure 4:
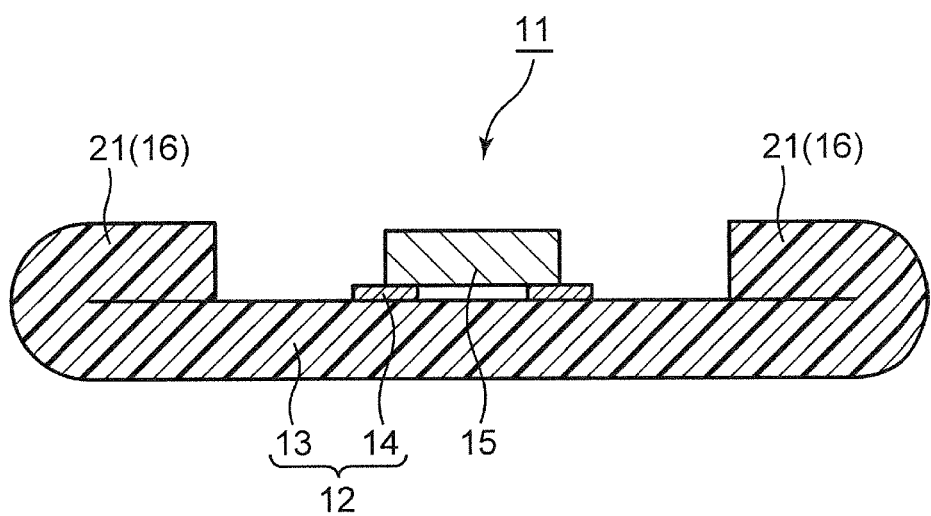
FIG. 4 is a sectional view illustrating another example of a circuit mounted article according to an embodiment of the present invention.

The reinforcing portion 16 may have any structure or any composition as long as it can diminish the risk of damage to the circuit board that occurs when the circuit board and the fabric are fixed with a fixing member without a reinforcing portion interposed therebetween. For example, the reinforcing portion 16 may be formed of a material same as that for the circuit board 12 or a material different from that for the circuit board 12. When the reinforcing portion 16 is formed of a material same as that for the circuit board, the circuit mounted article is assumed to have the configuration illustrated in FIG. 4 as one of the embodiments according to the present invention. In other words, as illustrated in FIG. 4, in the circuit mounted article 11, the reinforcing portion 21 (16) can also be formed by folding back the end of the circuit board 12 and bonding the circuit boards to each other. In this case, it can be said that the reinforcing portion 16 corresponds to a folded back portion 21 of the circuit board 12. By adopting such a configuration, it is not necessary to newly prepare a reinforcing portion, and it is possible to create the reinforcing portion only with the circuit board. FIG. 4 is a sectional view illustrating another example of the circuit mounted article 11 according to the present embodiment.

In the circuit mounted article 11, as illustrated in FIGS. 1 and 2, the reinforcing portion 16 is disposed in the end region of the circuit board 12, but the present invention is not limited to this. The circuit mounted article 11 may have a configuration in which the reinforcing portion is disposed at the end of the circuit board 12 so that the end face of the circuit board 12 and the end face of the reinforcing portion 16 are aligned with each other. The reinforcing portion 16 may be disposed in the end region of the circuit board 12 as illustrated in FIGS. 1 and 2, or the reinforcing portion 16 may be disposed at a part or region other than the end of the circuit board 12 and the end region of the circuit board 12. A configuration may be adopted in which the number of the reinforcing portions is not necessarily limited to two, and three or more reinforcing portions are disposed on the fabric facing face side of the circuit board. The reinforcing portion may be one. In this case, examples of the reinforcing portion include a reinforcing portion in which the reinforcing portions are joined to form one reinforcing portion in the case where the reinforcing portions are two as illustrated in FIGS. 1 and 2. However, a configuration may be adopted in which the reinforcing portion is disposed on the fabric facing face side of the circuit board so that the electronic component can be disposed to be surrounded by the circuit board and the fabric when the circuit mounted article is fixed to the fabric. This makes it possible to diminish the above-mentioned damage to the circuit component or the damage to the mounting structure (solder connection structure or the like) of the circuit component.

Figure 5:
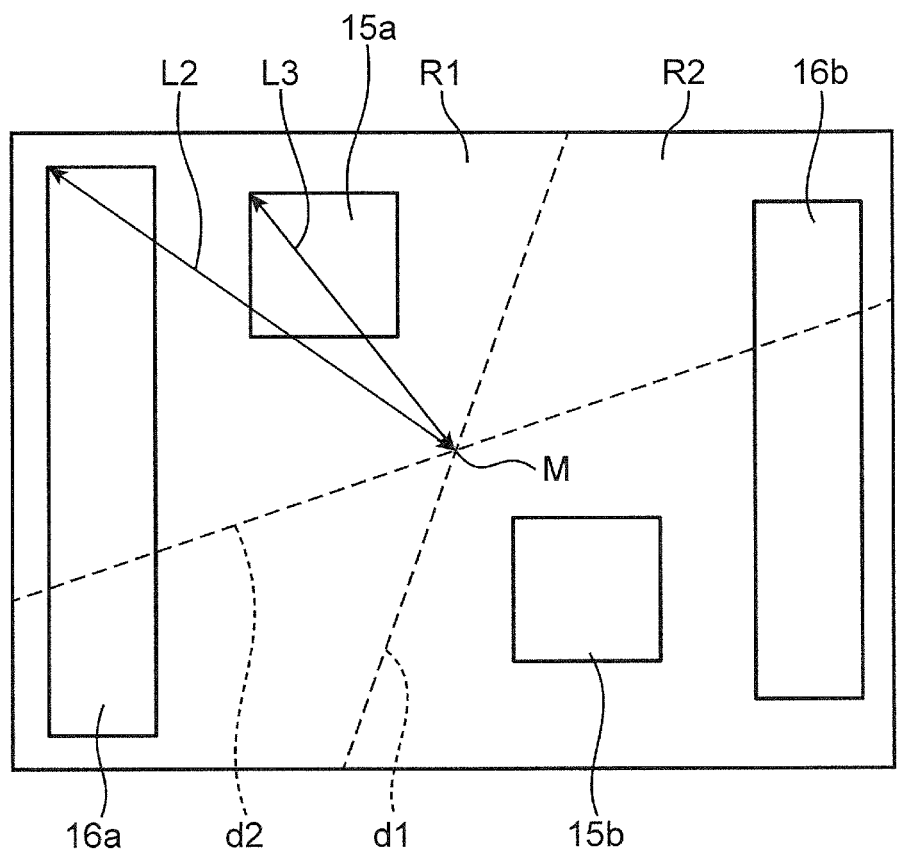
FIG. 5 is a diagram for explaining a positional relation between a reinforcing portion and an electronic component in a circuit mounted article according to an embodiment of the present invention.

The positional relation between the reinforcing portion and the electronic component in the circuit mounted article is not particularly limited, and examples thereof include the positional relation as illustrated in FIG. 5. FIG. 5 is a diagram for explaining the positional relation between the reinforcing portion and the electronic component in the circuit mounted article. FIG. 5 is a top view (diagram of top face viewed from the fabric facing face side) illustrating another example of the circuit mounted article according to an embodiment of the present invention, but the wiring pattern is omitted. As illustrated in FIG. 5, the position to be the midpoint in the top view of the circuit mounted article is denoted as M. When an arbitrary straight line passing through the midpoint M is drawn in the top view of the circuit mounted article, a line segment d1 between the ends of the circuit mounted article on the straight line is divided into two at the midpoint M. When the top view region of the circuit mounted article is divided into two by this line segment (line segment d1 in FIG. 5), the respective regions are denoted as a region R1 and a region R2 (see FIG. 5), the reinforcing portion is disposed at least at a part of the region R1 and may also be disposed at least at a part of the region R2. When an arbitrary straight line passing through the midpoint M is drawn in the top view of the circuit mounted article, at least in one line segment (corresponding to a line segment d2 in FIG. 5) among the arbitrary line segments, the reinforcing portion may be present on the line segment between the midpoint M and the end of the circuit mounted article (in FIG. 5, a reinforcing portion 16a is present on the line segment d2 in the region R1 and a reinforcing portion 16b is present on the line segment d2 in the region R2). The reinforcing portion and the electronic component may be disposed so that a distance L2 from the midpoint M to the site farthest from the midpoint M on the reinforcing portion is longer than a distance L3 from the midpoint M to the site farthest from the midpoint M on the electronic component in the top view of the circuit mounted article. By disposing the reinforcing portion and the electronic component in such disposition, the electronic component is surrounded by the circuit board and the fabric when the circuit mounted article is fixed to the fabric, and thus it is possible to diminish the damage to the circuit component or the damage to the mounting structure (solder connection structure or the like) of the circuit component similar to the above.

As a method for forming the reinforcing portion, the reinforcing portion can be formed on the fabric facing face side of the circuit board by printing or the like, or a configuration may be adopted in which a member to be used as the reinforcing portion is prepared and fixed with an adhesive, solder, or the like to a region where the reinforcing portion of the circuit board is formed.

Examples of the material for the reinforcing portion include fibers, a curable resin composition, and a thermoplastic resin composition from the viewpoint of enabling reinforcement. Examples of the fibers include woven fabrics, knitted fabrics, braids, and non-woven fabrics that are generally used as fabrics. The fibers may be a combination of these fibers in different forms. The curable resin composition is preferably a thermosetting resin composition, and examples thereof include silicone resin, urethane resin, epoxy resin, acrylic resin, and fluororubber. Examples of the thermoplastic resin contained in the thermoplastic resin composition include various rubbers such as ethylene propylene diene rubber, isoprene rubber, butadiene rubber, and chloroprene rubber, urethane resin, acrylic resin, and olefin resin. When the thermoplastic resin composition is used for the reinforcing portion that can be used in the present embodiment, olefin resin, acrylic resin, epoxy resin and the like are preferable. As the material for the reinforcing portion, the above materials may be used singly or in combination of two or more thereof. For example, the fibers and the resin compositions may be combined.

As described above, the circuit board 12 is not particularly limited as long as it has flexibility, and the structure thereof is not particularly limited. Examples of the circuit board 12 include a board including an insulating layer 13 and a wiring pattern 14 that is formed of a conductor and is provided on the surface or inside of the insulating layer 13 as illustrated in FIGS. 1 and 2. When the circuit board 12 is a stretchable circuit board, the insulating layer 13 is referred to as a stretchable insulating layer having stretchability, the wiring pattern 14 is referred to as a stretchable wiring pattern, and the circuit mounted article 11 is referred to as a stretchable circuit mounted article.

[Flexible Circuit Board]

The flexible circuit board used in the present embodiment is not particularly limited as long as it is a circuit board having flexibility, but examples thereof include a circuit board having an elongation rate of less than 10%, preferably less than 5%. The flexible circuit board may be, for example, a circuit board having an elongation rate of less than 10% and a tensile modulus of 10 MPa or more, preferably 50 MPa or more at room temperature of 25° C.

[Stretchable Circuit Board]

The stretchable circuit board used in the present embodiment is not particularly limited as long as it is a board used as a stretchable circuit board. The stretchable insulating layer, the stretchable wiring, the stretchable circuit board, and the stretchable circuit mounted article in the present embodiment each have stretchability. Here, "having stretchability" means that the material can be elastically deformed, and more specifically means that the material has an elongation rate of 10% or more and a tensile modulus of 0.5 to 500 MPa at room temperature of 25° C.

The elongation rate is 10% or more, preferably 25% or more, more preferably 50% or more, still more preferably 100% or more. It is more preferable as the elongation rate is higher, but the elongation rate is preferably 500% or less from the viewpoint that the thermoplastic resin undergoes plastic deformation and the original shape tends to be impaired when elongation occurs more than necessary. The tensile modulus at room temperature of 25° C. is 0.5 to 500 MPa, preferably 1 to 300 MPa, more preferably 2 to 200 MPa, still more preferably 2 to 100 MPa. When the elongation rate and the tensile modulus are within the ranges, the stretchable circuit board is easily deformed into an arbitrary shape, and the stretchable circuit board exhibits excellent followability to deformation of clothes, for example, when attached to clothes or the like. The tensile modulus refers to a storage modulus at 25° C. measured by performing temperature dependency measurement in a tensile test using a dynamic viscoelasticity measuring device. Examples of the dynamic viscoelasticity measuring device include DMS6100 manufactured by Seiko Instruments Inc.

[Stretchable Insulating Layer]

The composition of the resin composition used for the stretchable insulating layer is not particularly limited as long as the cured product of the resin composition has properties such as the elongation rate and tensile modulus described above.

Preferably, the resin composition contains a thermosetting resin and a curing agent of the thermosetting resin. More specific examples of the resin composition include a resin composition containing polyrotaxane (A), a thermosetting resin (B), and a curing agent (C). Hereinafter, each component will be described more specifically.

Specific examples of the polyrotaxane (A) include polyrotaxane as described in JP 4482633 B2 or WO 2015/052853 A1. As the polyrotaxane (A), a commercially available product may be used, and specifically SeRM Super Polymer A1000 manufactured by ASM Inc., and the like can be used.

Examples of the thermosetting resin (B) include thermosetting resins such as epoxy resin, phenol resin, polyimide resin, urea resin, melamine resin, unsaturated polyester, and urethane resin without particular limitation, and it is preferable to use epoxy resin among these.

Examples of the epoxy resin include bisphenol A type epoxy resin, bisphenol F type epoxy resin, bisphenol S type epoxy resin, aralkyl epoxy resin, phenol novolac type epoxy resin, alkylphenol novolac type epoxy resin, biphenol type epoxy resin, naphthalene type epoxy resin, dicyclopentadiene type epoxy resin, epoxidized products of condensates of phenols and aromatic aldehydes having a phenolic hydroxyl group, triglycidyl isocyanurate, and alicyclic epoxy resin. Depending on the situation, one of these may be used singly or two or more thereof may be used in combination.

As the epoxy resin, for example, an epoxy resin having two or more epoxy groups in one molecule and a molecular weight of 500 or more is preferably exemplified. As such an epoxy resin, a commercially available product may be used, and examples thereof include JER1003 (manufactured by Mitsubishi Chemical Corporation, molecular weight: 1300, bifunctional), EXA-4816 (manufactured by DIC Corporation, molecular weight: 824, bifunctional), and YP50 (manufactured by NIPPON STEEL Chemical & Material Co., Ltd., molecular weight: 60,000 to 80,000, bifunctional).

Examples of an epoxy resin different from the epoxy resin include an epoxy resin having an alkylene oxide-modified modifying group having 2 to 3 carbon atoms, 4 mol or more of the modifying group contained in 1 mol of epoxy molecule, an epoxy group of 2 mol or more, and an epoxy equivalent of 450 eq/mol or more. By containing this epoxy resin as the thermosetting resin (B) and the curing agent (C), it is possible to obtain a resin composition in which the cured product thereof exhibits the elongation and the tensile modulus. Specific examples of such an epoxy resin include propylene oxide added bisphenol A type epoxy resin (EP4003S manufactured by ADEKA Corporation) and ethylene oxide added hydroxyphenylfluorene type epoxy resin (EG-280 manufactured by Osaka Gas Chemicals Co., Ltd.). One of epoxy resins as described above may be used singly, or two or more thereof may be used concurrently.

The resin composition containing any single component of the polyrotaxane (A) or the thermosetting resin (B) and the curing agent (C) may be prepared, but it is preferable to prepare a resin composition containing both the components ((A) and (B)) and the curing agent (C) from the viewpoint of being easy to obtain a resin composition of which the cured product exhibits the elongation and the tensile modulus.

The curing agent (C) is not particularly limited as long as it acts as a curing agent for the thermosetting resin (B). In particular, examples of the curing agent for epoxy resin, which can be preferably used, include curing agents of phenol resin, amine-based compounds, acid anhydrides, imidazole-based compounds, sulfide resin, dicyandiamide, and sulfonium salts. The curing agents (C) may be used singly or in combination of two or more thereof. The resin composition may contain a curing accelerator, if necessary. Examples of the curing accelerator include imidazole-based compounds.

Among the resin compositions, a cross-linking agent may be further added to a resin composition containing polyrotaxane (A). As such a cross-linking agent, any cross-linking agent can be used without particular limitation as long as it can form a structure that cross-links with at least a part of the cyclic molecule of polyrotaxane (at least one reactive group of the cyclic molecule of polyrotaxane). Specific examples thereof include isocyanate resin and cyanuric chloride.

The proportion of each component in the resin composition is not particularly limited as long as the effects of the present invention can be exerted. For example, when all the components (A), (B), and (C) are contained, the polyrotaxane (A) is about 10 to 80 parts by mass, more preferably about 30 to 50 parts by mass; the thermosetting resin (B) is 10 to 89.9 parts by mass, more preferably 30 to 50 parts by mass; and the curing agent (C) is 0.1 to 30 parts by mass, more preferably about 0.1 to 20 parts by mass where the sum of the components (A) to (C) is 100 parts by mass. When the resin composition of the present embodiment contains isocyanate resin as a cross-linking agent, the isocyanate resin can be added at 0 to 50 parts by mass, more preferably 10 to 40 parts by mass with respect to the components of the polyrotaxane (A). When the component (B) and the component (C) are contained but the component (A) is not contained, the thermosetting resin (B) is about 50 to 99 parts by mass, more preferably about 60 to 80 parts by mass; and the curing agent (C) is about 1 to 50 parts by mass, more preferably about 1 to 40 parts by mass where the total amount of the resin composition is 100 parts by mass.

The resin composition may contain other additives, for example, curing catalysts (curing accelerators), flame retardants, flame retardant promoters, leveling agents, and colorants, if necessary, in a range in which the effects of the present invention are not impaired.

The method for preparing the resin composition containing an epoxy resin is not particularly limited, and for example, an epoxy resin, a curing agent, and a solvent are mixed together so as to be uniform. The solvent used is not particularly limited, and for example, toluene, xylene, methyl ethyl ketone, and acetone can be used. These solvents may be used singly or in combination of two or more thereof. Here, an organic solvent for adjusting the viscosity and various additives may be further blended, if necessary.

By heating and drying the resin composition obtained as described above, the resin composition is cured while the solvent is evaporated and the insulating layer of the present embodiment can be thus obtained.

The method and device for heating and drying the resin composition and the conditions of these may be various means similar to those conventionally used or improved means thereof. The specific temperature and time for heating can be appropriately set depending on the cross-linking agent, solvent and the like used, but the resin composition can be cured by, for example, being heated and dried at 50° C. to 200° C. for about 60 to 180 minutes.

The insulating layer (a molded body that is a cured product of the resin composition or the like) thus obtained may be subjected to surface treatment in order to stably form wiring (conductor layer) on one surface of the insulating layer. Various additives, for example, antioxidants, weather stabilizers, flame retardants, and antistatic agents can be added in a range in which the properties of the insulating layer are not impaired.

[Conductor Layer]

The circuit mounted article may further include a conductor layer on the fabric facing face side of the circuit board. Examples of the conductor layer include a metal foil, wiring formed of a conductive composition, an ultrathinly coated conductive layer, a conductive thread, and a metal molded product.

[Metal Foil]

Examples of the metal foil include copper foil (plating), aluminum foil, and stainless steel foil, and these metal foils may be metal foils subjected to surface treatment with a silane coupling agent and the like.

When the conductor layer is formed using the metal foil, a laminated body can be fabricated by stacking a metal foil such as a copper foil on the fabric facing face side of the insulating layer and subjecting this stacked body to hot press molding to laminate and integrate the stacked body. After that, a conductor layer (wiring) can be provided as a circuit on the surface of the insulating layer of the present embodiment by forming a circuit (wiring) by subjecting the metal foil to etching or the like. Examples of the method for forming a circuit include circuit formation by a semi additive process (SAP) or a modified semi additive process (MSAP) in addition to the method described above.

[Stretchable Wiring]

The stretchable wiring is not particularly limited as long as it is wiring having stretchability. Examples of the conductive stretchable material constituting the stretchable wiring include a conductive composition containing a conductive filler and a stretchable binder.

Specific examples of the conductive composition include a resin composition which contains a resin (D) that serves as a stretchable binder, a curing agent (E) that reacts with the resin (D), and a conductive filler (F) and in which the resin (D) has a functional group having a functional group equivalent of 400 g/eq or more and 10000 g/eq or less, the resin (D) and the cured product of the conductive composition have a glass transition temperature (Tg) or a softening point of 40° C. or less or an elastic modulus of less than 1.0 GPa at 30° C., and the conductive filler (F) is formed of a conductive substance having an intrinsic volume resistivity of $1 \times 10^{-4}$ Ω·cm or less at room temperature.

Hereinafter, each component will be described.

Specific examples of the conductive composition include a resin composition which contains a resin (D) that serves as a stretchable binder, a curing agent (E) that reacts with the resin (D), and a conductive filler (F) and in which the resin (D) has a functional group having a functional group equivalent of 400 g/eq or more and 10000 g/eq or less, the resin (D) and the cured product of the conductive composition have a glass transition temperature (Tg) or a softening point of 40° C. or less or an elastic modulus of less than 1.0 GPa at 30° C., and the conductive filler (F) is formed of a conductive substance having an intrinsic volume resistivity of $1 \times 10^{-4}$ Ω·cm or less at room temperature.

The resin (D) preferably has a weight average molecular weight of 50,000 or more. Hence, it is considered that bleeding is less likely to occur when a conductive pattern is printed using the conductive composition. Meanwhile, the upper limit of the weight average molecular weight is not particularly limited, but the weight average molecular weight range of the resin (D) is preferably 50,000 or more and 3 million or less, more preferably 100,000 or more and 1 million or less since there is the possibility that the viscosity increases and the handleability decreases when the molecular weight exceeds 3 million.

As the curing agent (E), various curing agents can be used without particular limitation as long as they exhibit reactivity with the resin (D) as described above. Specific examples of the curing agent (E) include radical generators and photoacid generators such as imidazole-based compounds, amine-based compounds, phenol-based compounds, acid anhydride-based compounds, isocyanate-based compounds, mercapto-based compounds, onium salts, and peroxides.

The conductive filler (F) is formed of a conductive substance having an intrinsic volume resistivity of $1\times10^{-4}$ Ω·cm or less at room temperature. When a material having an intrinsic volume resistivity of more than $1\times10^{-4}$ Ω·cm at room temperature is used, the volume resistivity of the conductive composition thus prepared is approximately $1\times10^{-3}$ Ω·cm to $1\times10^{-2}$ Ω·cm although it depends on the amount of the material blended. Hence, when a circuit is formed, the resistance value becomes high and the power loss becomes large.

Examples of the conductive substance (conductive substance having an intrinsic volume resistivity of $1\times10^{-4}$ Ω·cm or less at room temperature) include single substances composed of metal elements such as silver, copper, and gold and compounds such as oxides, nitrides, carbides, and alloys containing these elements. In addition to the conductive filler (F), a conductive or semiconductive conduction auxiliary may be added to the conductive composition for the purpose of further improving the conductivity. As such a conductive or semiconductive auxiliary, conductive polymers, ionic liquids, carbon black, acetylene black, carbon nanotubes, and inorganic compounds used in antistatic agents can be used, and one may be used or two or more may be used at the same time.

The shape of the conductive filler (F) is preferably a flat shape, and the aspect ratio of the thickness to the in-plane longitudinal direction of the conductive filler (F) is preferably 10 or more. When the aspect ratio is 10 or more, not only the surface area of the conductive filler with respect to the mass ratio becomes large and the efficiency of conductivity increases but also the adhesiveness with the resin component becomes favorable and an effect of improving the stretchability is exerted. When the aspect ratio is 1000 or less, more favorable conductivity and printability can be secured, and the aspect ratio is preferably 10 or more and 1000 or less, more preferably 20 or more and 500 or less. An example of the conductive filler having such an aspect ratio is a conductive filler having a tapped density of 6.0 g/cm³ or less measured by the tapping method. It is more preferable that the tapped density is 2.0 g/cm³ or less since the aspect ratio becomes larger.

With regard to the proportion of the conductive filler (F) blended in the conductive composition, the proportion of the conductive filler (F) blended is preferably 40% to 95% by mass from the viewpoint of conductivity, cost, and printability, more preferably 60% to 85% by mass with respect to the total amount of the conductive composition as a mass ratio.

In addition to the above components, additives and the like can be added to the conductive composition depending on the purpose. Examples of the additives include elastomers, surfactants, dispersants, colorants, fragrances, plasticizers, pH adjusting agents, viscosity regulators, ultraviolet absorbers, antioxidants, and lubricants.

The particle size of the conductive filler (F) is not particularly limited, but the average particle size (particle size at a cumulative volume of 50%; D50) measured by the laser light scattering method is preferably 0.5 μm or more and 30 μm or less, more preferably 1.5 μm or more and 20 μm or less from the viewpoint of printability at the time of screen printing and a moderate viscosity in kneading of the blended material.

The conductive filler (F) is preferably a conductive filler having the surface subjected to coupling treatment. Alternatively, the conductive composition may contain a coupling agent. This has an advantage that the adhesiveness between the binder resin and the conductive filler is further improved.

As a coupling agent to be added to the conductive composition or used for coupling treatment of the conductive filler, any coupling agent can be used without particular limitation as long as it adsorbs on the filler surface or reacts with the filler surface. Specific examples of the coupling agent include silane coupling agents, titanate-based coupling agents, and aluminum-based coupling agents.

When the coupling agent is used in the conductive composition, the amount thereof added is preferably about 1% to 20% by mass with respect to the whole resin composition.

The proportion of each component in the conductive composition is not particularly limited as long as the effects of the present invention can be exerted. The blended proportion of the resin (D) to the curing agent (E) can be appropriately determined depending on the kinds of resin and curing agent in consideration of the equivalent ratio and the like.

In addition to the above components, additives and the like can be added to the conductive composition depending on the purpose. Examples of the additives include elastomers, surfactants, dispersants, colorants, fragrances, plasticizers, pH adjusting agents, viscosity regulators, ultraviolet absorbers, antioxidants, and lubricants.

The method for forming the stretchable wiring is not particularly limited, and examples thereof include a method in which a coating film of the conductive composition is formed by applying or printing the conductive composition on an insulating layer as described above and the desired wiring (conductive pattern) is formed.

The conductive pattern or the like by the wiring can be formed on the surface of the insulating layer according to steps as described below. In other words, a coating film is first formed by applying or printing the conductive composition on the insulating layer, and volatile ingredients contained in the coating film are removed by drying. By subsequent step of curing the resin (D) and the curing agent (E) by curing step such as heating or electron beam or light irradiation, and step of reacting the coupling agent with the conductive filler (F) and the resin (D) with the curing agent (E), the conductive pattern by the stretchable wiring can be formed. Each condition in the curing step and reacting step is not particularly limited, and may be appropriately set depending on the kinds and desired forms of resin, curing agent, filler and the like.

The step of applying the conductive composition on a base material (on the stretchable insulating layer) is not particularly limited, but for example, coating methods using applicators, wire bars, comma rolls, gravure rolls and the like and printing methods using screen, flat plate offset, flexo, inkjet, stamping, dispenser, squeegee and the like can be used.

Figure 6:
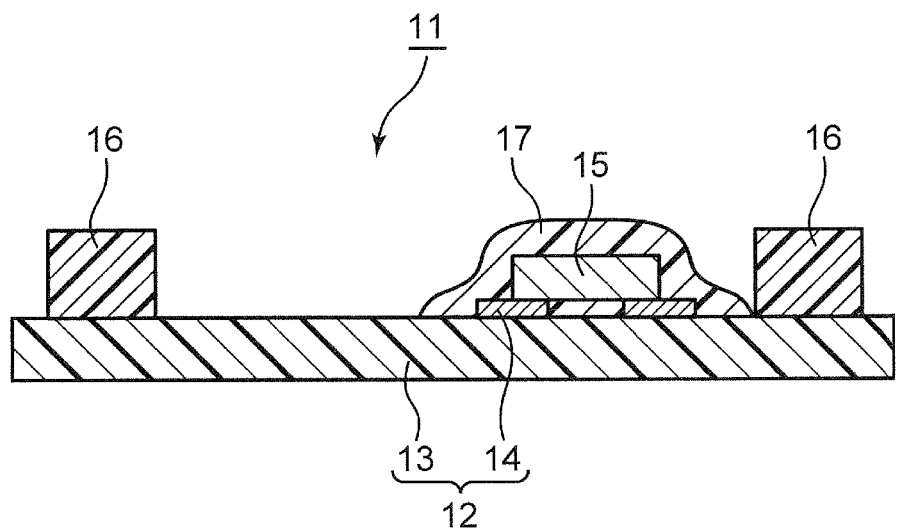
FIG. 6 is a sectional view illustrating another example of a circuit mounted article according to an embodiment of the present invention.

As illustrated in FIG. 6, in the circuit mounted article 11, at least a part of the electronic component 15 may be covered with a coating agent 17. FIG. 6 is a sectional view illustrating another example of the circuit mounted article 11 according to the present embodiment. The circuit mounted article 11 illustrated in FIG. 6 includes the circuit mounted article 11 illustrated in FIG. 1 and the coating agent 17 that covers the electronic component 15. The coating agent 17 may be configured to cover a part of the electronic component 15 or to cover the whole electronic component 15. When a plurality of the electronic components are mounted on the circuit board, only a part of the electronic components among the plurality of electronic components may be covered with the coating agent or all of the plurality of electronic components may be covered with the coating agent. By adopting such a configuration, at least a partial region of the unevenness appearing on the outer surface of the electronic component is covered with the coating agent and becomes smooth, and thus the texture when the fabric, to which the circuit mounted article is fixed, is brought into contact with the human body is improved and the feel of wearing is improved. The water resistance, for example, water resistance during washing of the circuit mounted article is improved since at least a part of the electronic component is covered with a coating agent. Since the electronic component is covered with the coating agent based on the circuit board, it is possible to improve the connection strength between the electronic component and the circuit board.

The coating agent 17 is not particularly limited as long as it is used as a coating agent for covering electronic components. For example, the same materials as those for the reinforcing portion may be adopted as the coating agent. By adopting such a configuration, it is also possible to form the reinforcing portion in the manufacturing process (assuming a printing process, a coating agent forming process using a dispenser, and the like) in which at least a part of the electronic component is covered with a coating agent in some cases. The covered part and the reinforcing portion can be formed at the same time by, for example, printing, and the efficiency of the production process can be improved. When the covered part where the coating agent covers the electronic component and the part of the reinforcing portion formed of the coating agent are in contact with each other and linked with each other, both the covered part and the reinforcing portion are firmly bonded to each other and fixed to the circuit board, and thus the risk that the covered part or the reinforcing portion peels off from the circuit board can be diminished.

Examples of the coating agent 17 include a curable resin composition and a thermoplastic resin composition. The curable resin composition is preferably a thermosetting resin composition, and examples thereof include silicone resin, urethane resin, epoxy resin, acrylic resin, and fluororubber. Examples of the thermoplastic resin contained in the thermoplastic resin composition include various rubbers such as ethylene propylene diene rubber, isoprene rubber, butadiene rubber, and chloroprene rubber, urethane resin, acrylic resin, and olefin resin. When the thermoplastic resin composition is used as the coating agent that can be used in the present embodiment, olefin resin, acrylic resin, epoxy resin and the like are preferable.

Figure 7:
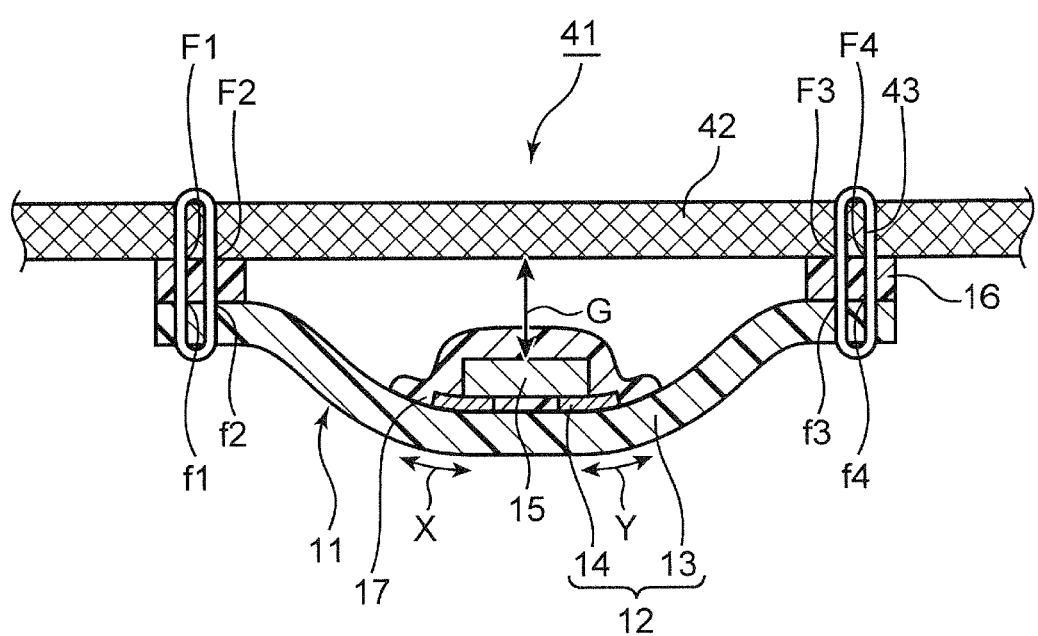
FIG. 7 is a sectional view illustrating another example of a device according to another embodiment of the present invention.

The circuit mounted article 11 may have a configuration in which the elastic modulus of the coating agent 17 is higher than the elastic modulus of the circuit board 12 and lower than the elastic modulus of the electronic component 15. FIG. 3 illustrates a configuration of the device 41 when the coating agent 17 is not applied to the electronic component 15. Here, in FIG. 3, an X region and a Y region represent the vicinity of the end position of the electronic component on the side of the contact assumed face with a person or the like of the circuit board. When the skin touches the X region and the Y region, the unevenness feel of the end of the electronic component is transferred through the circuit board having flexibility, and this may cause discomfort to the person. On the other hand, in the device 41, when at least a partial region of the electronic component 15 is covered with the coating agent 17, the coating agent is disposed around the X region and the Y region to play a role of a cushioning material that absorbs the unevenness feel of the end of the electronic component as illustrated in FIG. 7, and it is thus possible to diminish the discomfort of a person when the person touches the X region and the Y region.

When the elastic modulus of the coating agent is higher than the elastic modulus of the electronic component, similar to the electronic component, it is expected that the unevenness feel of the end of the covered part due to the coating agent is remarkably exerted and the feel of texture is deteriorated. On the other hand, when the elastic modulus of the coating agent is lower than that of the circuit board, it is expected that the function as a cushioning material that absorbs the unevenness feel of the end of the electronic component decreases and the feel of texture is deteriorated. FIG. 7 is a sectional view illustrating another example of the device 41 according to another embodiment of the present invention.

The elastic modulus here refers to the storage elastic modulus at 25° C. measured by performing temperature dependency measurement in a compression, shear, tensile, or bending test using a dynamic viscoelasticity measuring device. Examples of the dynamic viscoelasticity measuring device include DMS6100 manufactured by Seiko Instruments Inc.

The "elastic modulus of an electronic component" in the present application refers to the elastic modulus of the part having the lowest elastic modulus in the electronic component (refers to the elastic modulus of the part having the lowest elastic modulus among the plurality of electronic components when there are a plurality of the electronic components mounted on the circuit board). As a specific example, the elastic modulus of a resin package or the like of an electronic component corresponds to the "elastic modulus of an electronic component" in the present application in some cases.

The "elastic modulus of a circuit board" in the present application refers to the elastic modulus of an insulating layer constituting the circuit board. Specific examples thereof include the tensile elastic modulus of the stretchable insulating layer when the insulating layer is the stretchable insulating layer.

The "elastic modulus of a coating agent" in the present application refers to the elastic modulus of a coating agent used in the covered region.

The circuit mounted article 11 may have a configuration in which the distance between the reinforcing portion and the electronic component is larger than the height of the electronic component. The "distance between the reinforcing portion and the electronic component" in the present application refers to the shortest distance between the end of the electronic component and the end of the reinforcing portion.

Figure 8:
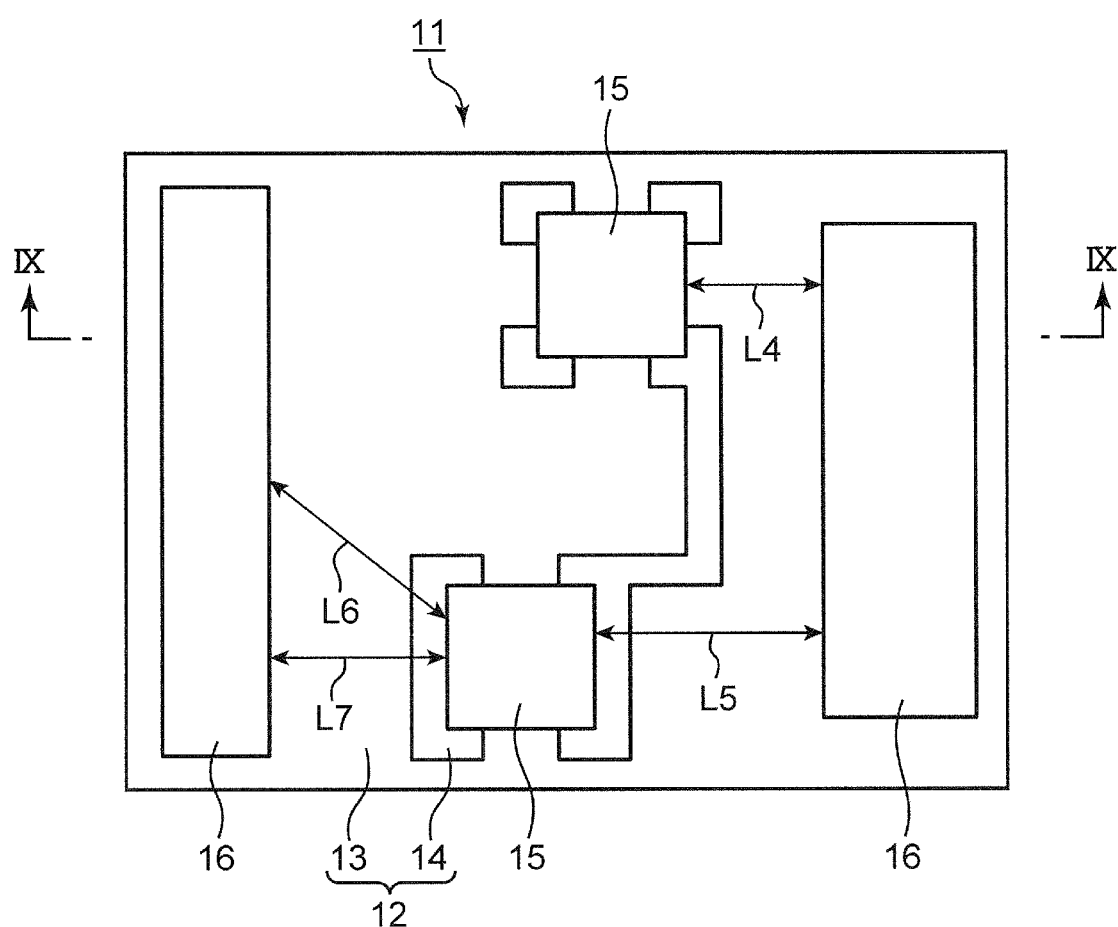
FIG. 8 is a top view illustrating another example of a circuit mounted article according to an embodiment of the present invention.

FIG. 8 is a top view (diagram of top face viewed from the fabric facing face side) illustrating another example of the circuit mounted article 11 according to an embodiment of the present invention, and is a diagram for explaining the distance between the reinforcing portion and the electronic component. In FIG. 8, the line segment joining the end of the electronic component and the end of the reinforcing portion together can be drawn infinitely (L4, L5, L6, L7 and the like in FIG. 8), but the "distance between the reinforcing portion 16 and the electronic component 15" in the present application corresponds to L4 that is the shortest distance between the end of the electronic component 15 and the end of the reinforcing portion 16. As also illustrated in FIG. 8, when a plurality of the electronic components are mounted on the circuit board, the "distance between the reinforcing portion 16 and the electronic component 15" in the present application refers to the length of the line segment (L4) that is the shortest among the line segments (L4, L7, and the like) joining the end of each electronic component and the end of the reinforcing portion together. Even if the electronic component is covered with a coating agent, the above definition (starting from the end of the electronic component) is adopted.

The "height of the electronic component" in the present application refers to the distance from the surface of the fabric facing face of the circuit board on which the electronic component is mounted to the farthest site of the electronic component surface measured in the vertical direction.

Figure 9:
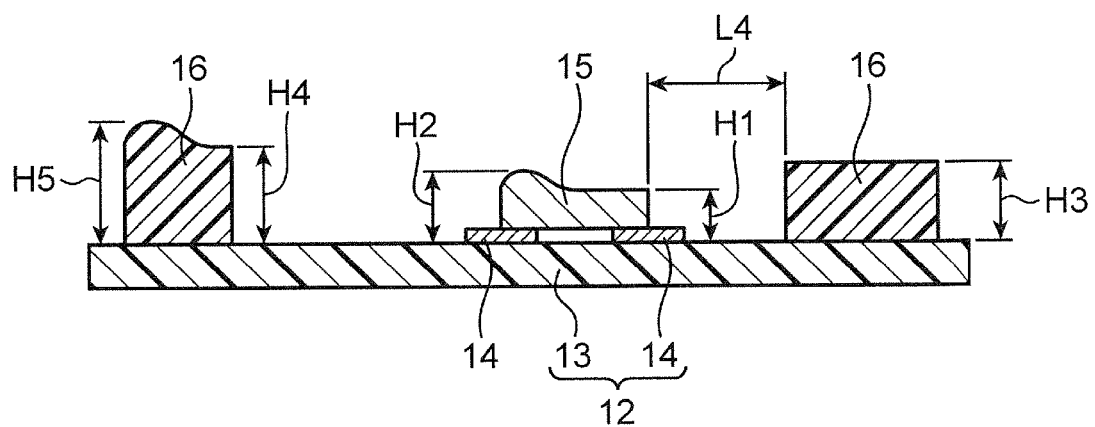
FIG. 9 is a sectional view of the circuit mounted article illustrated in FIG. 8 as viewed from a cut plane line IX-IX.

FIG. 9 is a sectional view of the circuit mounted article 11 illustrated in FIG. 8 as viewed from the cut plane line IX-IX, and is a diagram for explaining the height of the electronic component and the description of the reinforcing portion. As the height of the electronic component in FIG. 9, various lengths such as H1 and H2 can be measured, but the "height of the electronic component" in the present application corresponds to H2, which is the maximum height of the electronic component 15. Even if the electronic component is covered with a coating agent, the above definition (starting from the site of the electronic component) is adopted.

As the circuit mounted article, when a configuration is adopted in which the distance between the reinforcing portion and the electronic component is larger than the height of the electronic component (for example, when L4 is larger than H2 in FIG. 9), a distance G between the electronic component and the fabric in the device (for example, the device illustrated in FIGS. 3, 7, and 11) is likely to be secured, and it can be avoided that the electronic component and the fabric come into excessive contact with each other and excessive load is applied to the connection structure between the electronic component and the circuit board.

The circuit mounted article 11 may have a structure having a part where the height of the reinforcing portion 16 is higher than the height of the electronic component 15. The "height of the reinforcing portion" in the present application refers to the distance from the surface of the fabric facing face of the circuit board on which the reinforcing portion is mounted to the farthest site of the reinforcing portion surface measured in the vertical direction (similar concept to the height of electronic component described above). As the height of the reinforcing portion in FIG. 9, various lengths such as H3, H4, and H5 can be measured, but the "height of the reinforcing portion" in the present application corresponds to 115, which is the maximum height of the reinforcing portion 16.

By adopting a structure having a part where the height of the reinforcing portion 16 is higher than the height of the electronic component 15 (for example, when H5 is higher than H2 in FIG. 9), the electronic component being strongly pressed against the fabric can be suppressed even when the circuit mounted article is fixed to the fabric. This makes it possible to suppress the electronic component from excessively adhering to the fabric and the circuit mounted article being damaged.

Figure 10:
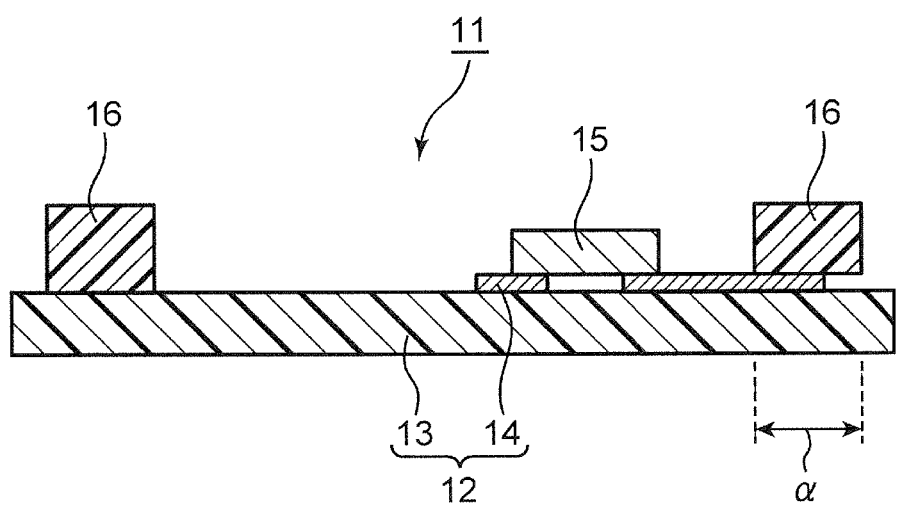
FIG. 10 is a sectional view illustrating another example of a circuit mounted article according to an embodiment of the present invention.

As illustrated in FIG. 10, the circuit mounted article may have a configuration in which the circuit board 12 includes the insulating layer 13 and the wiring pattern 14 that is formed of a conductor and is provided on the insulating layer 13 and the wiring pattern is present at least at a part of a region α where the reinforcing portion 16 of the circuit board 12 is formed. By adopting such a configuration, the strength of the region where the reinforcing portion is formed can be increased, and the risk can be diminished that damage such as tearing of the circuit board occurs when the reinforcing portion and the fabric are fixed with the fixing member. FIG. 10 is a sectional view illustrating another example of the circuit mounted article 11 according to an embodiment of the present invention.

Figure 11:
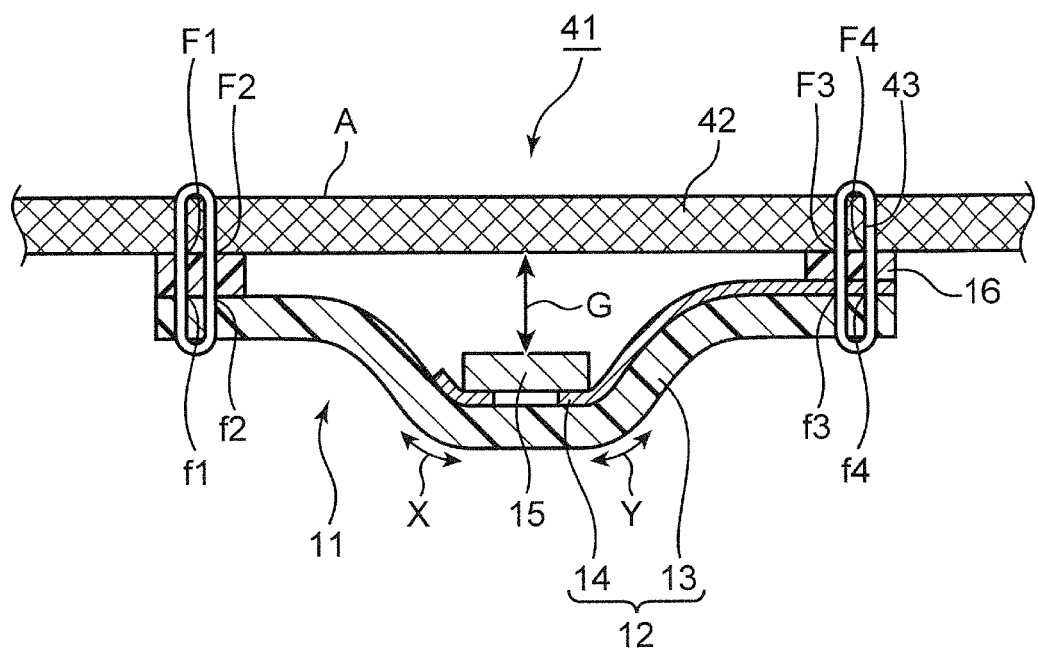
FIG. 11 is a sectional view illustrating another example of a device according to another embodiment of the present invention.

As illustrated in FIG. 11, the device 41 may have a configuration in which the wiring pattern 14 is present in the region α. In such a device 41, a form may be adopted in which the fabric 42 and the circuit board 12 are fixed with the reinforcing portion 16 interposed therebetween using a fixing member having conductivity (for example, a thread or metal fitting having conductivity is assumed). When such a form is adopted, a part of the fixing member having conductivity is exposed on the side of the contact assumed face with a person or the like of the circuit board. In addition, a part of the fixing member having conductivity is exposed on the A side (see FIG. 11) of the fabric. For example, by fixing the circuit mounted article at a position where the contact assumed face with a person or the like of the circuit board illustrated in FIG. 11 touches the skin of the human body (for example, it is assumed that the circuit mounted article is fixed onto the inner side of the clothes), it is also possible to use a fixing member exposed on the contact assumed face with a person or the like as a probe for human body information acquirement. In this case, the wiring pattern that is electrically connected to the fixing member having conductivity is also electrically connected to the electronic component that acquires and processes the human body signal. FIG. 11 is a sectional view illustrating another example of the device 41 according to another embodiment of the present invention.

Figure 12:
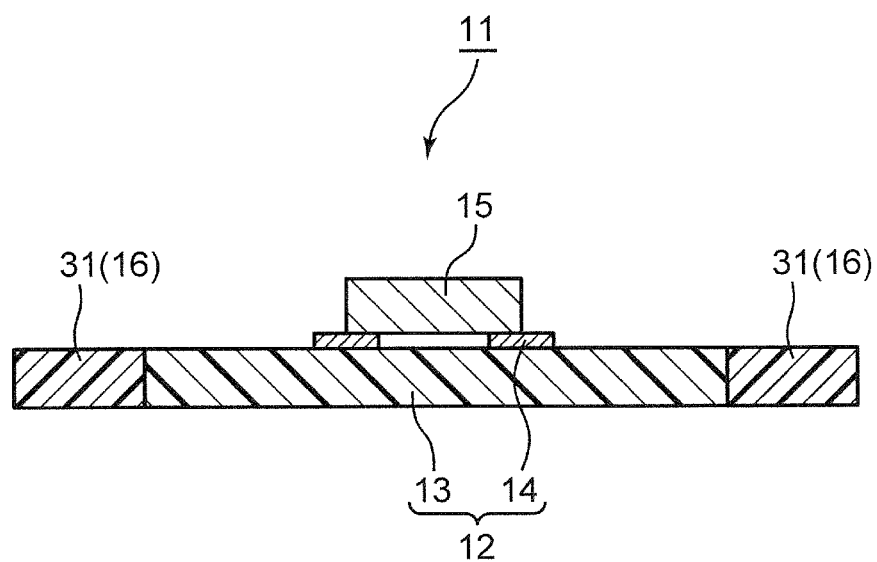
FIG. 12 is a sectional view illustrating an example of a circuit mounted article according to another embodiment of the present invention.

As illustrated in FIG. 12, a circuit mounted article 11 according to another embodiment of the present invention is a circuit mounted article to be fixed to a fabric, which includes a circuit board 12 having flexibility, an electronic component 15 mounted on a fabric facing face side, which faces the fabric, of the circuit board 12, and a reinforcing portion 31 (16) to be used for fixing of the circuit mounted article to the fabric of the circuit board 12. The reinforcing portion 31 is connected to the circuit board 12 and is used for fixing of the circuit mounted article to the fabric. FIG. 12 is a sectional view illustrating an example of the circuit mounted article 11 according to another embodiment of the present invention.

The reinforcing portion 31 is formed of a material having a higher elastic modulus than an insulating layer 13 of the circuit board 12. As a specific example of the circuit mounted article 11, the insulating layer 13 of the circuit board 12 is first formed of a fiber base material and a resin impregnated into the fiber base material. Similar to the insulating layer 13, the reinforcing portion 31 is also formed of a fiber base material and a resin impregnated into the fiber base material. A configuration is assumed in which the fiber base material of the insulating layer 13 and the fiber base material of the reinforcing portion 31 are continuously linked and a resin having a higher elastic modulus than the resin that is impregnated into the insulating layer 13 is adopted as the resin to be used for the reinforcing portion 31 (resin to be impregnated into the fiber base material). By adopting such a configuration, the risk can be diminished that the reinforcing portion is damaged when the circuit mounted article is fixed to the fabric with the reinforcing portion interposed therebetween and, as a result, the damage also spreads to the circuit board.

Examples of the resin used for the reinforcing portion 31 include a curable resin composition and a thermoplastic resin composition. The curable resin composition is preferably a thermosetting resin composition, and examples thereof include silicone resin, urethane resin, epoxy resin, acrylic resin, and fluororubber. Examples of the thermoplastic resin contained in the thermoplastic resin composition include various rubbers such as ethylene propylene diene rubber, isoprene rubber, butadiene rubber, and chloroprene rubber, urethane resin, acrylic resin, and olefin resin. When the thermoplastic resin composition is used as the coating agent that can be used in the present embodiment, olefin resin, acrylic resin, epoxy resin and the like are preferable.

A device 41 according to another embodiment of the present invention includes the circuit mounted article 11, a fabric 42, and a fixing member 43 for fixing the circuit mounted article 11 and the fabric 42 as illustrated in FIG. 3. The reinforcing portion 16 and the fabric 42 are fixed to each other with the fixing member 43 so that the face (fabric facing face) on which the electronic component 15 of the circuit mounted article 11 is mounted faces the fabric 42.

Figure 13:
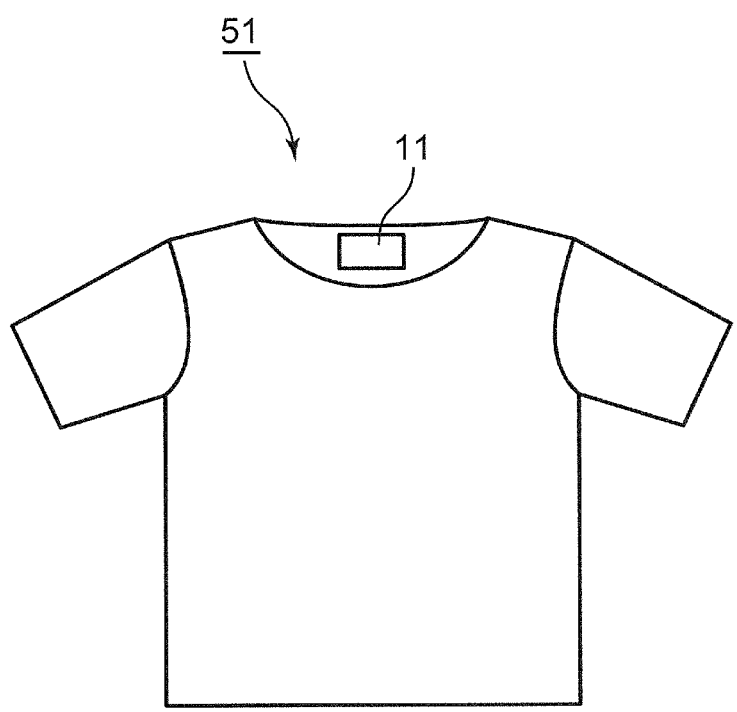
FIG. 13 is a schematic view illustrating an example of clothing to which a circuit mounted article according to an embodiment of the present invention is fixed.

The fabric 42 is not necessarily particularly limited, and examples thereof include clothing. When the fabric 42 is a fabric constituting clothing, as an example of the position where the circuit mounted article 11 is fixed, a position as illustrated in FIG. 13 (the position that is the inner side of clothing and the vicinity of the back of the wearer's neck when the clothing is worn by a person) is assumed.

As an application destination of clothing 51 to which the circuit mounted article 11 is fixed, it is assumed that a salesperson of the store wears the clothing 51 and the action log of the salesperson at the store is acquired and an athlete wears the clothing 51 and data on the exercise state of the athlete is acquired. FIG. 13 is a schematic view illustrating an example of clothing to which the circuit mounted article according to the present embodiment is fixed, and the fixing position of the circuit mounted article is not limited to this. For example, when it is assumed that the tag of clothing is replaced with the circuit mounted article, a position that is the inner side of the clothing and does not cause discomfort when worn can be a candidate for the fixing position of the circuit mounted article.

The kind of the fixing member is not particularly limited as long as it can fix the reinforcing portion and the fabric. Examples of the fixing member include an adhesive, a thread, and a metal fitting. The thread used as the fixing member may be a thread having conductivity (hereinafter, conductive thread). When the fixing member is a conductive thread, the fixing member can be used as an electrode or can also be used as a probe for acquiring information on the state of the human body by bringing the fixing member into contact with the human body or the like.

As illustrated in FIG. 3, the device 41 may have a configuration in which there are two or more fixing positions where the reinforcing portion and the fabric are fixed with the fixing member, and there is a method for selecting two fixing positions satisfying a condition that the length of the fabric present between two arbitrarily selected fixing positions is shorter than the length of the circuit mounted article present between the two selected fixing positions.

The "length of the fabric present between two arbitrarily selected fixing positions" in the present application refers to the length of the shortest line segment L1$a$ when two arbitrarily selected fixing positions are bound along the surface of the face side facing the circuit mounted article of the fabric (hereinafter referred to as the circuit mounted article facing face side). Here, since the fixing position of the surface of the circuit mounted article facing face of the fabric is not strictly point-shaped but planar, the place where the line segment joining two fixing positions is the shortest is selected in this plane. In the device illustrated in FIG. 3, there are four fixing positions (F1, F2, F3, and F4) on the circuit mounted article facing face side of the fabric, and thus as the length of the fabric (the length on the surface of the circuit board facing face of the fabric) present between two arbitrarily selected fixing positions among these four fixing positions, there are six candidates of the length from F1 to F3, the length from F1 to F4, the length from F2 to F3, the length from F2 to F4, the length from F1 to F2, and the length from F3 to F4.

The "length of the circuit mounted article present between the two selected fixing positions" in the present application refers to the length of the shortest line segment L1$b$ when these two fixing positions are bound along the surface on the fabric facing face side of the circuit board focusing on the two fixing positions selected when the length of the fabric described above is calculated. Here, since the fixing position of the surface of the fabric facing face of the circuit mounted article is also not strictly point-shaped but planar, the place where the line segment joining two fixing positions is the shortest is selected in this plane. In FIG. 3, there are four fixing positions (f1, f2, f3, and f4) on the fabric facing face side of the circuit mounted article, and thus as the length of the circuit mounted article (the length on the surface of the fabric facing face of the circuit board) present between two arbitrarily selected fixing positions among these four fixing positions, there are six candidates of the length from f1 to f3, the length from f1 to f4, the length from f2 to f3, the length from f2 to f4, the length from f1 to f2, and the length from f3 to f4.

Based on the above definitions, the fact that "there is a method for selecting two fixing positions satisfying a condition that the length of the fabric present between two arbitrarily selected fixing positions is shorter than the length of the circuit mounted article present between the two selected fixing positions" means that there is a method for selecting a fixing position where the length of the fabric present between the two fixing positions is shorter than the length of the circuit mounted article when two fixing positions are arbitrarily selected from a plurality of fixing positions. Hereinafter, the above definition will be described based on the device illustrated in FIG. 3. For example, focusing on the fixing positions F1 and F3 and the corresponding fixing positions f1 and 13, the length of the fabric from the fixing position F1 to the fixing position F3 is compared with the length of the circuit mounted article from the fixing position f1 to the fixing position f3. Similarly, the length of the fabric from the fixing position F1 to the fixing position F4 is compared with the length of the circuit mounted article from the fixing position f1 to the fixing position f4. The length of the fabric is compared with the length of the circuit mounted article in all combinations (a total of 6 combinations of a combination of from F2 to F3 with from f2 to 13, a combination of from F2 to F4 with from f2 to f4, a combination of from F1 to F2 with from f1 to f2, a combination of from F3 to F4 with from f3 to f4, and these two combinations). The lengths were compared in all the combinations, and as a result, the length of the fabric is shorter than the length of the circuit mounted article in four combinations of the combination of from F1 to F3 with from f1 to f3, the combination of from F1 to F4 with from f1 to f4, the combination of from F2 to F3 with from f2 to f3, and the combination of from F2 to F4 with from f2 to f4. Hence, the configuration illustrated in FIG. 3 can be said to be a configuration in which there is a method for selecting two fixing positions satisfying a condition that the length of the fabric present between two arbitrarily selected fixing positions is shorter than the length of the circuit mounted article present between the two selected fixing positions. In the device configured in this way, the electronic component is not strongly pressed against the fabric, and it is thus possible to suppress the occurrence of conduction failure between the electronic component and the wiring pattern on the circuit board.

The fixing position of the circuit mounted article on the clothing is not particularly limited as long as it is a position where the electronic component of the circuit mounted article suitably operates. As the fixing position of the circuit mounted article 11 on the clothing 51, for example, an arbitrary position in the inner region of the clothing when the clothing 51 is worn is assumed. By fixing the circuit mounted article in this region, the circuit mounted article is not exposed to the outside and the design of the clothing is not impaired when the clothing is worn by a person. Among the inner regions of clothing, the region, where the display tag such as the material for the clothing is currently fixed, particularly such as the upper and lower regions on the back side can be a candidate for the fixing position. As an example, it is assumed that the circuit mounted article is fixed at a position that is the inner region of the clothing and is close to the clothing hanger when the clothing is hung on a clothing hanger as illustrated in FIG. 13.

Figure 14:
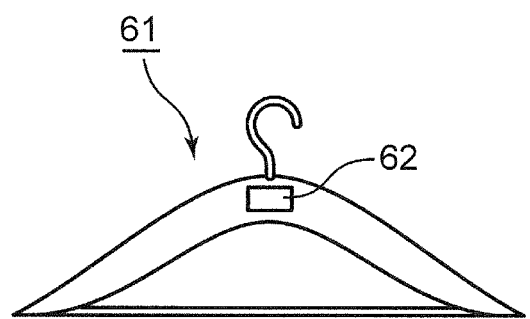
FIG. 14 is a schematic view illustrating an example of a clothing hanger for hanging clothing to which a circuit mounted article according to an embodiment of the present invention is fixed.

The device may have a configuration in which the circuit mounted article is fixed at a position where the electronic component to be provided in the circuit mounted article can perform contactless communication or contactless power supply from a power transmission electronic component capable of performing contactless communication or contactless power supply with the electronic component to be provided in the circuit mounted article when the clothing is hung on a clothing hanger including the power transmission electronic component in a case where the fabric is a fabric constituting clothing (see FIG. 13). In this case, the clothing hanger may be configured to include the power transmission electronic component at a position where the electronic component to be provided in the circuit mounted article can perform contactless communication or contactless power supply from the power transmission electronic component. Specifically, as a clothing hanger 61, the power transmission electronic component 62 is disposed in a partial region of the frame part of the clothing hanger as illustrated in FIG. 14. By adopting such a configuration, contactless communication between the electronic component to be provided in the circuit mounted article and the power transmission electronic component to be provided in the clothing hanger is possible as the clothing provided with the circuit mounted article is only hung on the clothing hanger. In such a case, the device can transfer data held by the electronic component provided in the circuit mounted article to the power transmission electronic component or can transfer data from the power transmission electronic component to the electronic component of the circuit mounted article. The device can also transmit power from the power transmission electronic component to the electronic component of the circuit mounted article. Needless to say, the power transmission electronic component and the electronic component of the circuit mounted article have a block (for example, an antenna) necessary for wireless communication and wireless power transmission. FIG. 14 is a schematic view illustrating an example of a clothing hanger for hanging clothing to which the circuit mounted article according to an embodiment of the present invention is fixed.

The clothing hanger may be configured so that the power transmission electronic component can be detached therefrom. By doing so, it is possible to improve the convenience of work such as charge of the power transmission electronic component and transfer of the data stored in the power transmission electronic component (data received from the circuit mounted article) to another device. When there is feel of resistance to hang the clothing on a clothing hanger, for example, when the clothing is wet with sweat or the like after exercise, the power transmission electronic component is detached from the clothing hanger and only the power transmission electronic component is disposed in the vicinity of the circuit mounted article fixed to the clothing. By doing so, necessary data can be transferred from the electronic component constituting the circuit mounted article. As a result, the user can confirm the activity data such as the amount of exercise immediately after the exercise.

This application is based on Japanese Patent Application No. 2019-079143 filed on Apr. 18, 2019, the contents of which are included in the present application.

In order to express the present invention, the present invention has been described above appropriately and sufficiently through the embodiments. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

INDUSTRIAL APPLICABILITY

According to the present invention, there is provided a circuit mounted article that can be suitably fixed to a fabric and a device in which a circuit mounted article is suitably fixed to a fabric.

The invention claimed is:

1. A circuit mounted article to be fixed to a fabric, the circuit mounted article comprising:
   a circuit board having flexibility;
   an electronic component mounted on a fabric facing face side, which faces the fabric, of the circuit board; and
   a reinforcing portion to be used for fixing of the circuit mounted article to the fabric on the fabric facing face side of the circuit board, wherein
   the circuit board is a stretchable circuit board including a stretchable insulating layer and a stretchable wiring pattern, the stretchable insulating layer including a cured product of a resin composition containing polyrotaxane, a thermosetting resin, and a curing agent for the thermosetting resin,
   the stretchable wiring pattern including a conductive composition and being on a surface or in an inside of the stretchable insulating layer, and
   the stretchable circuit board has an elongation rate of 10% or more and a tensile modulus of 0.5 to 500 MPa at 25° C.

2. The circuit mounted article according to claim 1, wherein at least a part of the electronic component is covered with a coating agent.

3. The circuit mounted article according to claim 2, wherein the coating agent is formed of a material same as a material for the reinforcing portion.

4. The circuit mounted article according to claim 2, wherein an elastic modulus of the coating agent is higher than an elastic modulus of the circuit board and lower than an elastic modulus of the electronic component.

5. The circuit mounted article according to claim 1, wherein the reinforcing portion is formed of a material same as a material for the circuit board.

6. The circuit mounted article according to claim 1, wherein a distance between the reinforcing portion and the electronic component is larger than a height of the electronic component.

7. The circuit mounted article according to claim 1, wherein there is a part where a height of the reinforcing portion is higher than a height of the electronic component.

8. The circuit mounted article according to claim 1, wherein
- the circuit board includes an insulating layer and a wiring pattern that is formed of a conductor and is provided on the insulating layer, and
- the wiring pattern is present at least at a part of a region where the reinforcing portion of the circuit board is formed.

9. A device comprising:
- the circuit mounted article according to claim 1;
- a fabric; and
- a fixing member for fixing the circuit mounted article and the fabric,
- wherein the reinforcing portion and the fabric are fixed to each other with the fixing member so that a face, on which the electronic component is mounted, of the circuit mounted article faces the fabric.

10. The device according to claim 9, wherein
- there are two or more fixing positions where the reinforcing portion and the fabric are fixed with the fixing member, and
- there is a method for selecting two fixing positions satisfying a condition that a length of the fabric present between two arbitrarily selected fixing positions is shorter than a length of the circuit mounted article present between the two selected fixing positions.

11. The device according to claim 9, wherein
- the fabric is a fabric that constitutes clothing, and
- the circuit mounted article is fixed at a position where the electronic component to be provided in the circuit mounted article can perform contactless communication or contactless power supply from a power transmission electronic component capable of performing contactless communication or contactless power supply with the electronic component to be provided in the circuit mounted article when the clothing is hung on a clothing hanger including the power transmission electronic component.

12. The device according to claim 9, wherein the fixing member has conductivity.

13. A circuit mounted article to be fixed to a fabric, the circuit mounted article comprising:
- a circuit board having flexibility;
- an electronic component mounted on a fabric facing face side, which faces the fabric, of the circuit board; and
- a reinforcing portion to be used for fixing of the circuit board to the fabric, wherein
- the circuit board is a stretchable circuit board including a stretchable insulating layer and a stretchable wiring pattern, the stretchable insulating layer including a cured product of a resin composition containing polyrotaxane, a thermosetting resin, and a curing agent for the thermosetting resin,
- the stretchable wiring pattern including a conductive composition and being on a surface or in an inside of the stretchable insulating layer, and
- the stretchable circuit board has an elongation rate of 10% or more and a tensile modulus of 0.5 to 500 MPa at 25° C.

14. A device comprising:
- the circuit mounted article according to claim 9;
- a fabric; and
- a fixing member for fixing the circuit mounted article and the fabric,
- wherein the reinforcing portion and the fabric are fixed to each other with the fixing member so that a face, on which the electronic component is mounted, of the circuit mounted article faces the fabric.

* * * * *